(12) United States Patent
Hong

(10) Patent No.: US 8,896,354 B1
(45) Date of Patent: Nov. 25, 2014

(54) DRIVING DEVICE

(71) Applicant: SK Hynix Inc., Icheon-si, Gyeonggi-do (KR)

(72) Inventor: Yun Seok Hong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/077,852

(22) Filed: Nov. 12, 2013

(30) Foreign Application Priority Data

Jun. 17, 2013 (KR) .......................... 10-2013-0068827

(51) Int. Cl.
*H03K 3/00* (2006.01)
*H03K 3/012* (2006.01)
(52) U.S. Cl.
CPC ..................................... *H03K 3/012* (2013.01)
USPC .......................................................... 327/108
(58) Field of Classification Search
USPC .......................................................... 327/108
See application file for complete search history.

(56) References Cited

U.S. PATENT DOCUMENTS

| 5,646,550 A * | 7/1997 | Campbell et al. ............... 326/81 |
| 2004/0041607 A1 | 3/2004 | Pan |
| 2008/0303558 A1 | 12/2008 | Rho |

FOREIGN PATENT DOCUMENTS

| KR | 1020080108853 A | 12/2008 |
| KR | 1020090072789 A | 7/2009 |

* cited by examiner

*Primary Examiner* — Daniel Rojas
(74) *Attorney, Agent, or Firm* — William Park & Associates Patent Ltd.

(57) ABSTRACT

A driving device is disclosed, which relates to a technology for reducing consumption of a leakage current unnecessary for a driver circuit. The driving device includes: a pre-driver configured to output a drive control signal upon receiving a power-supply voltage in response to an input signal, and change a voltage level of the drive control signal in response to a control signal so as to selectively provide the changed voltage level; an output driver configured to receive the power-supply voltage in response to the drive control signal, and output the received power-supply voltage to an output terminal; and a bulk-voltage controller configured to selectively control bulk-voltage levels of the pre-driver and the output driver in response to the control signal.

21 Claims, 2 Drawing Sheets

DRIVING DEVICE

CROSS-REFERENCE TO RELATED APPLICATION

This application claims priority to Korean patent application No. 10-2013-0068827, filed on Jun. 17, 2013, in the Korean Intellectual Property Office, which is incorporated herein by reference in its entirety as set forth in full.

BACKGROUND OF THE INVENTION

1) Field of the Invention

Embodiments of the present invention relate to a driving device, and more particularly to a technology for reducing consumption of a leakage current unnecessary for a driver circuit.

2) Description of the Related Art

Generally, Integrated Circuits (ICs) include Input/Output (I/O) pins for receiving/transmitting data from/to an external part, and a data output circuit for providing data to the external part. In this case, the I/O pins are coupled to a transmission line such as a printed wiring transmission lines mounted to a substrate of IC devices. Internal data of one IC is applied to another IC through a transmission line acting as an interface.

FIG. 1 is a block diagram illustrating a data output device according to the related art.

Referring to FIG. 1, the data output device includes a pre-driver 10 and an output driver 20.

The pre-driver 10 receives power-supply voltages (VDDQ, VSSQ), and synchronizes data of a global I/O line (GIO) with a clock (DCLK), such that the pre-driver 10 outputs a pull-up signal (PU) and a pull-down signal (PD). The output driver 20 is pulled up or down in response to the pull-up signal (PU) and the pull-down signal (PD), such that the output driver 20 outputs data. The output driver 20 serving as a main driver adjusts impedance to support a high-speed operation of the IC such that the output driver 20 can be matched with impedance of a transmission channel.

In this case, a voltage switching operation of the pull-up and pull-down driving actions is achieved between one power-supply voltage VDDQ and the other power-supply voltage VSSQ. If a mobile device stays in a low power-supply voltage VDD, a high-and-low level of the swing operation is set to a low level (e.g., 1.2V).

As the mobile devices are configured to use a lower power-supply voltage, transistor characteristics rapidly deteriorate. In order to improve such transistor characteristics, a transistor is configured to have a very short channel length or a low threshold voltage. That is, transistors contained in an output driver IC configured to use a low power-supply voltage typically have a very small gate width.

However, if the transistor is configured to have a long channel length or a low threshold voltage, an off-leakage current of the transistor gradually increases in a standby mode. That is, a leakage current occurs even when there is a small voltage difference between a source and a drain of each MOS transistor in a standby mode of the output driver.

Accordingly, operation characteristics of mobile devices deviate from specification ranges such as a leakage current of IDD2, IDD6, DPD (Deep Power Down) and DQ pins. However, a leakage current generated from a MOS transistor is a very small amount of current, such that this leakage current does not greatly affect power consumption of integrated circuits (ICs) when there is a small number of output drivers.

However, as the integration degree of the integrated circuits (ICs) are gradually increased, the number of output drivers is also increased in proportion to the increasing integration degree of the ICs. If the number of output drivers is increased, the amount of a leakage current is also increased, resulting in an increase in total power consumption of the ICs.

In order to reduce such leakage current, the related art has used the scheme for cutting off source power of transistors. However, a larger-sized driver for facilitating the supply of source power of transistors is needed. In addition, as a frequency becomes gradually higher, the number of transistors to be driven is also increased, so that mobile devices may have difficulty in easily receiving a power source. In addition, if a leakage current of the driver increases, a DC failure unavoidably occurs, resulting in reduction of a production yield.

In recent times, systems configured to use semiconductor memory devices have been rapidly developed to have smaller sizes and lower power consumption. Therefore, it is impossible for high power-consumption semiconductor memory devices to be used for small-sized or portable-sized systems, such that commercial viability thereof is greatly decreased. A leakage current encountered in products (such as mobile phones) that have low power-consumption as important elements for high product competitiveness is directly associated with such product competitiveness.

BRIEF SUMMARY OF THE INVENTION

Various embodiments of the present invention are directed to providing a driving device that substantially obviates one or more problems due to limitations and disadvantages of the related art.

The embodiment of the present invention relates to a driving device for controlling a power source of a pre-driver during a standby mode such that it can reduce a channel-off leakage current of a transistor at the last output end of a driver.

In accordance with an embodiment of the present invention, a driving device includes: a pre-driver configured to output a drive control signal upon receiving a power-supply voltage in response to an input signal, and change a voltage level of the drive control signal in response to a control signal so as to selectively provide the changed voltage level; an output driver configured to receive the power-supply voltage in response to the drive control signal, and output the received power-supply voltage to an output terminal; and a bulk-voltage controller configured to selectively control bulk-voltage levels of the pre-driver and the output driver in response to the control signal.

It is to be understood that both the foregoing general description and the following detailed description of the present invention are exemplary and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
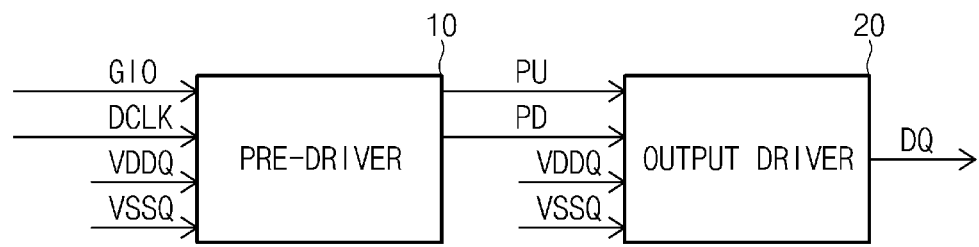
FIG. 1 is a block diagram illustrating a data output device according to the related art.
Figure 2:
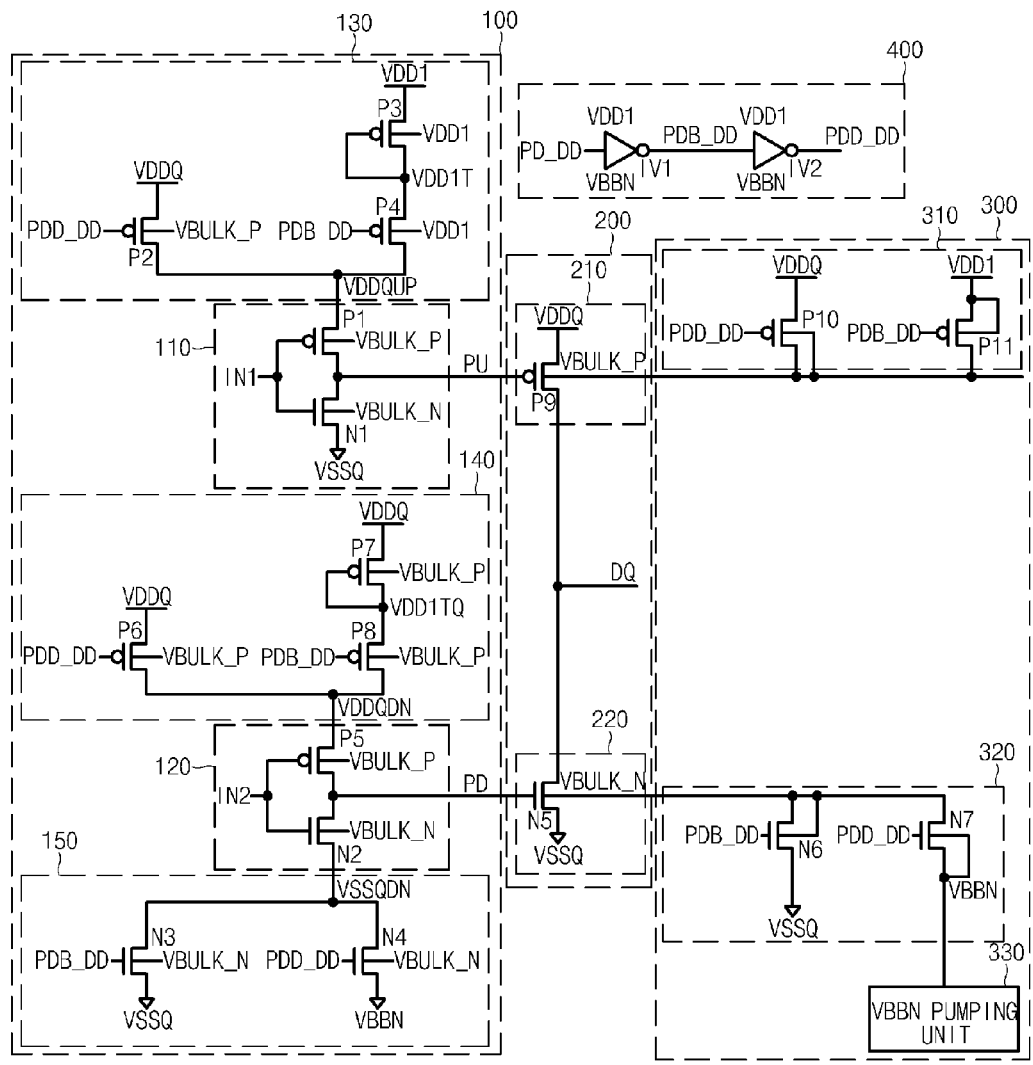
FIG. 2 is a circuit diagram illustrating a driving device according to embodiments.

FIG. 2 is a circuit diagram illustrating a driving device according to embodiments.

Referring to FIG. 2, the driving device according to the embodiments includes a pre-driver 100, an output driver 200, a bulk-voltage controller 300, and a control signal generator 400.

The pre-driver 100 receives a power-supply voltage in response to input signals (IN1, IN2) so that the pre-driver 100 outputs a drive control signal to the output driver 200. The output driver 200 activates data in response to the drive control signal, and outputs the resultant data to an output terminal (DQ). The bulk-voltage controller 300 controls bulk-voltage levels of the pre-driver 100 and the output driver 200 in response to control signals (PDD_DD, PDB_DD). In addition, the control signal generator 400 inverts and delays the control signal PD_DD, such that the control signal generator 400 outputs control signals (PDB_DD, PDD_DD).

The pre-driver 100 includes a pull-up pre-driver 110, a pull-down pre-driver 120, a pull-up power controller 130, a pull-down power controller 140, and a pull-down controller 150.

In some embodiments, the pull-up pre-driver 110 includes a PMOS transistor P1 and an NMOS transistor N1. The PMOS transistor P1 and the NMOS transistor N1 are coupled in series between a power-source node (VDDQUP) and a ground voltage (VSSQ) input terminal. The PMOS transistor P1 and the NMOS transistor N1 receive an input signal IN1 through a common gate terminal. The PMOS transistor P1 receives a pull-up bulk voltage (VBULK_P) through a bulk terminal, and the NMOS transistor N1 receives a pull-down bulk voltage (VBULK_N) through a bulk terminal. The PMOS transistor P1 and the NMOS N1 output a pull-up drive control signal (PU) through a common drain terminal.

The pull-down pre-driver 120 includes a PMOS transistor P5 and an NMOS transistor N2. The PMOS transistor P5 and the NMOS transistor N2 are coupled in series between a power-source node (VDDQDN) and a ground node (VSSQDN). The PMOS transistor P5 and the NMOS transistor N2 receive an input signal IN2 through a common gate terminal. The PMOS transistor P5 receives a pull-up bulk voltage (VBULK_P) through a bulk terminal, and the NMOS transistor N2 receives a pull-down bulk voltage (VBULK_N) through a bulk terminal.

The pull-up power controller 130 includes a plurality of PMOS transistors P2~P4 acting as pull-up drive elements. The PMOS transistor P2 is coupled between a power-supply voltage (VDDQ) input terminal and a power-source node (VDDQUP), so that the PMOS transistor P2 receives a control signal (PDD_DD) through a gate terminal. The PMOS transistor P2 receives a pull-up bulk voltage (VBULK_P) through a bulk terminal. The PMOS transistors (P3, P4) are coupled in series between the power-supply voltage (VDD1) input terminal and the power-source node (VDDQUP). A gate terminal and a drain terminal of the PMOS transistor P3 are commonly coupled to each other. A gate terminal of the PMOS transistor P4 receives a control signal (PDB_DD). In addition, the PMOS transistors (P3, P4) are configured to receive a power-supply voltage VDD1 through a bulk terminal.

The pull-down power controller 140 includes a plurality of PMOS transistors P6~P8 acting as pull-up drive elements. The PMOS transistor P6 is coupled between a power-supply voltage (VDDQ) input terminal and a power-source node (VDDQDN), so that the PMOS transistor P6 receives a control signal (PDD_DD) through a gate terminal. The PMOS transistor P6 receives a pull-up bulk voltage (VBULK_P) through a bulk terminal. The PMOS transistors (P7, P8) are coupled in series between the power-supply voltage (VDDQ) input terminal and the power-source node (VDDQDN). A gate terminal and a drain terminal of the PMOS transistor P7 are commonly coupled to each other. A gate terminal of the PMOS transistor P8 receives a control signal (PDB_DD). In addition, the PMOS transistors (P7, P8) are configured to receive a pull-up bulk voltage (VBULK_P) through a bulk terminal.

The pull-down controller 150 includes NMOS transistors (N3, N4) acting as pull-down drive elements. The NMOS transistor N3 is coupled between a ground node (VSSQDN) and a ground voltage (VSSQ) input terminal. The NMOS transistor N3 receives a control signal (PDB_DD) through a gate terminal. The NMOS transistor N4 is coupled between the ground node (VSSQDN) and a back-bias voltage (VBBN) input terminal, such that the NMOS transistor N4 receives a control signal (PDD_DD) through a gate terminal. The NMOS transistors (N3, N4) are configured to receive a pull-down bulk voltage (VBULK_N) through a bulk terminal.

In accordance with the embodiments, a channel-off leakage current in the standby mode may occur in a PMOS transistor P9 and an NMOS transistor N5. In order to prevent the channel-off leakage current of the PMOS transistor P9 and the NMOS transistor N5, the PMOS transistor P9 and the NMOS transistor N5 receive different levels of voltage from the pre-driver 100 serving as a previous stage of the output driver 200.

In addition, the output driver 200 includes a pull-up driver 210 and a pull-down driver 220.

In some embodiments, the pull-up driver 210 includes a PMOS transistor P9 serving as a pull-up drive element. The PMOS transistor P9 is coupled between the power-supply voltage (VDDQ) input terminal and the output terminal (DQ), and receives a pull-up drive control signal (PU) through a gate terminal. The PMOS transistor P9 receives a pull-up bulk voltage (VBULK_P) through a bulk terminal.

The pull-down driver 220 includes an NMOS transistor N5 serving as a pull-down drive element. The NMOS transistor N5 is coupled between the output terminal (DQ) and the ground voltage (VSSQ) input terminal, such that the NMOS transistor N5 receives a pull-down drive control signal (PD) through a gate terminal. The NMOS transistor N5 receives a pull-down bulk voltage (VBULK_N) through a bulk terminal.

The bulk-voltage controller 300 includes a pull-up controller 310 and a pull-down bulk controller 320.

The pull-up bulk controller 310 includes PMOS transistors (P10, P11) serving as pull-up drive elements. The PMOS transistor P10 is coupled between the power-supply voltage (VDDQ) input terminal and the pull-up bulk voltage (VBULK_P) output terminal, such that PMOS transistor P10 receives a control signal (PDD_DD) through a gate terminal. The PMOS transistor P10 receives the pull-up bulk voltage (VBULK_P) through a bulk terminal. The PMOS transistor P11 is coupled between the power-supply voltage (VDD1) input terminal and the pull-up bulk voltage (VBULK_P) output terminal, such that the PMOS transistor P11 receives a control signal (PDB_DD) through a gate terminal. The PMOS transistor P11 receives the power-supply voltage (VDD1) through a bulk terminal.

The pull-down bulk controller 320 includes NMOS transistors (N6, N7) serving as pull-down drive elements. The NMOS transistor N6 is coupled between the pull-down bulk voltage (VBULK_N) output terminal and the ground voltage (VSSQ) input terminal, such that the NMOS transistor N6 receives a control signal (PDB_DD) through a gate terminal. The NMOS transistor N6 receives the pull-down bulk voltage (VBULK_N) through a bulk terminal. The NMOS transistor N7 is coupled between the pull-down bulk voltage (VBULK_N) output terminal and the back-bias voltage (VBBN) input terminal, such that the NMOS transistor N7 receives a control signal (PDD_DD) through a gate terminal. The NMOS transistor N7 receives the back-bias voltage (VBBN) through a bulk terminal.

The back-bias voltage pumping unit 330 is configured to pump the back-bias voltage (VBBN), such that the back-bias voltage pumping unit 330 outputs the back-bias voltage (VBBN) to a source terminal and a bulk terminal of the NMOS transistor N7.

The control signal generator 400 includes a plurality of inverters (IV1, IV2). The inverter IV1 is driven in response to the power-supply voltage (VDD1) and the back-bias voltage (VBBN), and inverts the control signal (PD_DD) so as to output the other control signal (PDB_DD). The inverter IV2 is driven in response to the power-supply voltage (VDD1) and the back-bias voltage (VBBN), and inverts the control signal (PDB_DD) so as to output the other control signal (PDD_DD).

The operations of the above-mentioned driving device according to the embodiments will hereinafter be described in detail.

In accordance with the embodiments, a power source of the pre-driver 100 is changed to another power source during a standby mode. That is, a negative bias is applied to the output driver 200 without loss of slew of the pre-driver 100, and a bulk voltage of each of the pre-driver 100 and the output driver 200 is increased such that an off-leakage current can be reduced.

If the input signals (IN1, IN2) are at a high level during a normal operation mode, the NMOS transistor N1 of the pull-up pre-driver 110 and the NMOS transistor N2 of the pull-down pre-driver 120 are turned on. Accordingly, the pull-up drive control signal (PU) and the pull-down drive control signal (PD) are at a low level.

As a result, the PMOS transistor P9 of the pull-up driver 210 is turned on, and the NMOS transistor N5 of the pull-down driver 220 is turned off. If the pull-up driver 210 starts operation, the power-supply voltage (VDDQ) is applied to the output terminal (DQ) such that the pull-up driver 210 outputs high data.

In contrast, if the input signals (IN1, IN2) are at a low level, the PMOS transistor P1 of the pull-up pre-driver 110 and the PMOS transistor P5 of the pull-down pre-driver 120 are turned on. Therefore, the pull-up drive control signal (PU) and the pull-down drive control signal (PD) are at a high level.

As a result, the PMOS transistor P9 of the pull-up driver 210 is turned off, and the NMOS transistor N5 of the pull-down driver 220 is turned on. If the pull-down driver 220 starts operation, the ground voltage (VSSQ) is applied to the output terminal (DQ) such that the pull-down driver 220 outputs low data.

If the above-mentioned IC driver operates in the normal operation mode, the IC driver adjusts the pull-up and pull-down slew rates of data according to whether transistors of the pull-up pre-driver 110 and the pull-down pre-driver 120 are turned on or off. If the IC driver is in the standby mode, the PMOS transistor P9 of the pull-up driver 210 and the NMOS transistor N5 of the pull-down driver 220 are turned off, so that no current flows in the output terminal (DQ).

However, as a mobile device is configured to use a low power-supply voltage, transistor characteristics are rapidly deteriorated, such that an off-leakage current of each transistor may occur in the pull-up driver 210 and the pull-down driver 220. In addition, assuming that each of the PMOS transistor P9 and the NMOS transistor N5 contained in the output driver 200 acting as the last output end has a large channel width, an off-leakage current may occur in PMOS transistor P9 and NMOS P5 during the standby mode.

In order to reduce the off-leakage current, the embodiments may control (i.e., change) a source power of the pull-up pre-driver 110 using the pull-up power controller 130, and may control (i.e., change) a source power of the pull-down pre-driver 120 using the pull-down power controller 140.

That is, the control signal (PD_DD) is at a low level state during the normal operation mode. The control signal (PD_DD) transitions to a high level during a power-down mode, and transitions to a low level during the normal operation mode.

If the normal mode starts operation, the control signal (PD_DD) transitions to a low level. The control signal (PDB_DD) is an inversion signal of the control signal (PD_DD). As a result, during the normal operation mode, the control signal (PDB_DD) is at a high level so that the control signal (PDB_DD) has a power-supply voltage (VDD1) level, and the other control signal (PDD_DD) is at a low level so that the control signal (PDD_DD) has a back-bias voltage (VBBN) level.

Accordingly, during the normal operation mode, the PMOS transistor P2 of the pull-up power controller 130 is turned on, and the PMOS transistor P4 of the pull-up power controller 130 is turned off. As a result, a power node (VDDQUP) is at a power-supply voltage (VDDQ) level during the normal operation mode.

On the other hand, the control signal (PD_DD) transitions to a high level during the standby mode. During the standby mode, the control signal (PDB_DD) is at a low level so that it has a back-bias voltage (VBBN) level, and the other control signal (PDD_DD) is at a high level so that it has a power-supply voltage (VDD1) level.

Accordingly, during the standby mode, the PMOS transistor P2 of the pull-up power controller 130 is turned off, and the PMOS transistor P4 of the pull-up power controller 130 is turned on. The PMOS transistor P3 is configured to provide a power-supply voltage (VDD1T) to a power node of the PMOS transistor P4. The PMOS transistor P4 is configured to provide a power-supply voltage (VDD1T) to a power node (VDDQUP). As a result, the power node (VDDQUP) is at the power-supply voltage (VDD1T) level during the standby mode. In one example, the power-supply voltage (VDD1T) is identical to a voltage level obtained when a threshold voltage of the PMOS transistor P3 is subtracted from the power-supply voltage (VDD1). The power-supply voltage (VDD1T) is higher than the other power-supply voltage (VDDQ).

If the power-supply voltage (VDD1) is at a very high level, a faulty operation may occur in the pull-up pre-driver 110, such that the PMOS transistor P3 is needed for reducing the power-supply voltage (VDD1) level. Assuming that the power-supply voltage (VDD1) level can be stably controlled, the driving device of the embodiments may be designed not to include the PMOS transistor P3.

As described above, if the driving device of the embodiments operates in the normal mode, the power-supply voltage (VDDQ) is used as a source power of the pull-up pre-driver 110. If the driving device of the embodiments operates in the standby mode, the power-supply voltage (VDD1T) higher than the other power-supply voltage (VDDQ) is used as a source power of the pull-up pre-driver 110. If the voltage level of the pull-up drive control signal (PU) becomes higher, a negative bias is applied to a gate terminal of the PMOS transistor P9, such that an off-leakage current of the PMOS transistor P9 can be reduced.

Likewise, during the normal operation mode, the PMOS transistor P6 of the pull-down power controller 140 is turned on, and the PMOS transistor P8 of the pull-down power controller 140 is turned off. Accordingly, the power node (VDDQDN) is at a power-supply voltage (VDDQ) level during the normal operation mode.

During the normal operation mode, the NMOS transistor N3 of the pull-down controller 150 is turned on. Accordingly, the ground node (VSSQDN) is at a ground voltage (VSSQ) level.

During the standby mode, the PMOS transistor P6 of the pull-down power controller 140 is turned off, and the PMOS transistor P8 of the pull-down power controller 140 is turned on. The PMOS transistor P7 provides a power-supply voltage (VDD1TQ) to a node of the PMOS transistor P8. As a result, the power node (VDDQDN) is at a power-supply voltage (VDD1TQ) level during the standby mode. In this case, the power-supply voltage (VDD1TQ) is identical to a voltage level obtained when a threshold voltage of the PMOS transistor P7 is subtracted from the power-supply voltage (VDDQ). The power-supply voltage (VDD1TQ) is lower than the other power-supply voltage (VDDQ).

If the power-supply voltage (VDDQ) is at a very high level, a faulty operation may occur in the pull-down pre-driver 120, such that the PMOS transistor P7 is needed for reducing the power-supply voltage (VDDQ) level. Assuming that the power-supply voltage (VDDQ) level can be stably controlled, the driving device of the embodiments may be designed not to include the PMOS transistor P7.

During the standby mode, the NMOS transistor N4 of the pull-down controller 150 is turned on. Accordingly, the ground node (VSSQDN) is at a back-bias voltage (VBBN) level. In this case, the back-bias voltage (VBBN) is lower than the ground voltage (VSSQ).

As described above, if the driving device of the embodiments operates in the normal mode, the power-supply voltage (VDDQ) is used as a source power of the pull-down pre-driver 120. If the driving device of the embodiments operates in the standby mode, the power-supply voltage (VDD1TQ) lower than the other power-supply voltage (VDDQ) is used as a source power of the pull-down pre-driver 120. In addition, if the driving device is in the standby mode, the back-bias voltage (VBBN) lower than the ground voltage (VSSQ) is used as a drain power of the pull-down pre-driver 120.

Therefore, assuming that a voltage level of the pull-down drive control signal (PD) is gradually reduced, a negative bias is applied to a gate terminal of the NMOS transistor N5, such that an off-leakage current of the NMOS transistor N5 can be reduced.

On the other hand, since the control signal (PDD_DD) is at a low level during the normal operation mode, the PMOS transistor P10 of the pull-up bulk controller 310 is turned on and the PMOS transistor P11 is turned off. As a result, the pull-up bulk voltage (VBULK_P) is at the power-supply voltage (VDDQ) level. That is, during the normal operation mode, the power-supply voltage (VDDQ) is applied to the pull-up driver 210, and a voltage equal to the power-supply voltage (VDDQ) is applied to the bulk terminal of PMOS transistor P9 in the form of the pull-up bulk voltage (VBULK_P).

In addition, during the normal operation, the control signal (PDB_DD) is at a high level, such that the NMOS transistor N6 of the pull-down bulk controller 320 is turned on and the NMOS transistor N7 of the pull-down bulk controller 320 is turned off. As a result, the pull-down bulk voltage (VBULK_N) is at the ground voltage (VSSQ) level. That is, during the normal operation mode, the ground voltage (VSSQ) level applied to the pull-down driver 220, and a voltage equal to the ground voltage (VSSQ) level is applied to the bulk terminal of the NMOS transistor N5 in the form of the pull-down bulk voltage (VBULK_N).

On the other hand, during the standby mode, the control signal (PDB_DD) is at a low level, so that the PMOS transistor P10 of the pull-up bulk controller 310 is turned off and the PMOS transistor P11 of the pull-up bulk controller 310 is turned on. As a result, the pull-up bulk voltage (VBULK_P) is at a power-supply voltage (VDD1) level. That is, during the standby mode, the power-supply voltage (VDD1) higher than the power-supply voltage (VDDQ) applied to the pull-up driver 210 is applied to the bulk terminal of the PMOS transistor P9.

In addition, during the standby mode, since the control signal (PDD_DD) is at a high level, the NMOS transistor N6 of the pull-down bulk controller 320 is turned off and the NMOS transistor N7 of the pull-down bulk controller 320 is turned on. As a result, the pull-down bulk voltage (VBULK_N) is at the back-bias voltage (VBBN) level. That is, during the standby mode, the ground voltage (VSSQ) applied to the pull-down driver 220 and the low back-bias voltage (VBBN) is applied to the bulk terminal of the NMOS transistor N5.

During the standby mode, the pull-up pre-driver 110, the pull-down pre-driver 120, the pull-down power controller 140, and the pull-down controller 150 may receive the pull-up bulk voltage (VBULK_P) and the pull-down bulk voltage (VBULK_N) through bulk terminals. Therefore, during the standby mode, transistors of the pull-up pre-driver 110, the pull-down pre-driver 120, the pull-down power controller 140, and the pull-down controller 150 are prevented from being unnecessarily turned on. However, the pull-up power controller 130 receives the pull-up bulk voltage (VBULK_P) through a bulk terminal of the PMOS transistor P2, and receives the power-supply voltage (VDD1) through the PMOS transistors (P3, P4).

In accordance with the above-mentioned embodiments, currents (IDD2P, IDD3P, IDD6), a current of the output terminal, or a Deep Power Down (DPD) current can be reduced. Specifically, the above-mentioned embodiments can be efficiently applied to a mobile DRAM or DDR4 configured to use heterogeneous power-supply voltages (such as VDD1 and VDD2), or can also be efficiently applied to other devices (such as X32 and X64) having a large number of output pins As is apparent from the above description, the driving device according to the embodiments controls a power source of a pre-driver during a standby mode, such that the driving device reduces a channel-off leakage current of a transistor at the last output end of a driver.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an example embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A driving device comprising:
a pre-driver configured to output a drive control signal upon receiving a power-supply voltage in response to an input signal, and change a voltage level of the drive control signal in response to a control signal so as to selectively provide the changed voltage level;
an output driver configured to receive the power-supply voltage in response to the drive control signal, and output the received power-supply voltage to an output terminal; and
a bulk-voltage controller configured to selectively control bulk-voltage levels of the pre-driver and the output driver in response to the control signal,
wherein the bulk-voltage controller includes:
a pull-up bulk controller configured to output a pull-up bulk voltage and change a voltage level of the pull-up bulk voltage in response to the control signal; and
a pull-down bulk controller configured to output a pull-down bulk voltage and change a voltage level of the pull-down bulk voltage in response to the control signal.

2. The driving device according to claim 1, further comprising:
a control signal generator configured to change a level of the control signal in response to a power-down mode.

3. The driving device according to claim 1, wherein the pre-driver includes:
a pull-up pre-driver configured to receive the power-supply voltage in response to the input signal so as to output a pull-up drive control signal;
a pull-down pre-driver configured to receive the power-supply voltage so as to output a pull-down drive control signal;
a pull-up power controller configured to change a power level of the pull-up pre-driver in response to the control signal; and
a pull-down power controller configured to change a power level of the pull-down pre-driver in response to the control signal.

4. The driving device according to claim 3, wherein the pull-up power controller includes:
a first pull-up drive element configured to provide a first power-supply voltage to a power node of the pull-up pre-driver in response to the control signal, during a normal mode; and
a second pull-up drive element configured to provide a second power-supply voltage higher than the first power-supply voltage to the power node in response to the control signal, during a standby mode.

5. The driving device according to claim 4, wherein the pull-up power controller further includes:
a third pull-up drive element configured to receive a third power-supply voltage and provide the second power-supply voltage higher than the first power-supply voltage to a power node of the second pull-up drive element.

6. The driving device according to claim 5, wherein the second pull-up drive element and the third pull-up drive element receive a third power-supply voltage.

7. The driving device according to claim 3, wherein the pull-down controller includes:
a fourth pull-up drive element configured to provide a first power-supply voltage to a power node of the pull-down pre-driver in response to the control signal, during a normal mode; and
a fifth pull-up drive element configured to provide a fourth power-supply voltage lower than the first power-supply voltage to the power node in response to the control signal, during a standby mode.

8. The driving device according to claim 7, wherein the pull-down power controller further includes:
a sixth pull-up drive element configured to receive the first power-supply voltage and provide the fourth power-supply voltage to a power node of the fifth pull-up drive element.

9. The driving device according to claim 3, wherein the pre-driver further includes:
a pull-down controller configured to selectively provide different voltages to a ground node of the pull-down pre-driver in response to the control signal.

10. The driving device according to claim 9, wherein the pull-down controller further includes:
a first pull-down drive element configured to provide a ground voltage to a ground node of the pull-down pre-driver in response to the control signal, during a normal mode; and
a second pull-down drive element configured to provide a back-bias voltage lower than the ground voltage to the ground node in response to the control signal, during a standby mode.

11. The driving device according to claim 1, wherein the pull-up bulk controller output a pull-up bulk voltage at a first power-supply voltage level during a normal mode, and output the pull-up bulk voltage at a third power-supply voltage level higher than the first power-supply voltage during a standby mode, upon receiving the control signal
wherein the pull-down bulk controller output a pull-down bulk voltage at a ground voltage level during a normal mode, and output the pull-down bulk voltage at a back-bias voltage level lower than the ground voltage during a standby mode, upon receiving the control signal.

12. The driving device according to claim 11, wherein the pull-up bulk controller includes:
a seventh pull-up drive element configured to output the pull-up bulk voltage at the first power-supply voltage level during the normal mode; and
an eighth pull-up drive element configured to output the pull-up bulk voltage at the third power-supply voltage level during the standby mode.

13. The driving device according to claim 12, wherein the seventh pull-up drive element receives the pull-up bulk voltage through a bulk terminal.

14. The driving device according to claim 12, wherein the eighth pull-up drive element receives the third power-supply voltage through a bulk terminal.

15. The driving device according to claim 11, wherein the pull-down bulk controller includes:
a third pull-down drive element configured to output the pull-down bulk voltage at the ground voltage level during the normal mode; and a fourth pull-down drive element configured to output the pull-down bulk voltage at the back-bias voltage level during the standby mode.

16. The driving device according to claim 15, wherein the third pull-down drive element receives the pull-down bulk voltage through a bulk terminal.

17. The driving device according to claim 15, wherein the fourth pull-down drive element receives the back-bias voltage through a bulk terminal.

18. The driving device according to claim 11, wherein the bulk-voltage controller further includes:
   a back-bias voltage pumping unit configured to pump and output the back-bias voltage.

19. The driving device according to claim 1, wherein the output driver includes:
   a pull-up driver configured to activate a first power-supply voltage in response to a pull-up drive control signal, and output the activated power-supply voltage to an output terminal; and
   a pull-down driver configured to activate a ground voltage in response to a pull-down drive control signal, and output the activated ground voltage to the output terminal.

20. The driving device according to claim 19, wherein:
   the pull-up driver receives the pull-up drive control signal at the first power-supply voltage level during a normal mode; and
   the pull-up driver receives the pull-up drive control signal at a third power-supply voltage level higher than the first power-supply voltage during a standby mode.

21. The driving device according to claim 19, wherein:
   the pull-down driver receives the pull-down drive control signal at the first power-supply voltage level during a normal mode; and
   the pull-down driver receives the pull-down drive control signal at a fourth power-supply voltage level lower than the first power-supply voltage during a standby mode.

* * * * *